United States Patent
Echevarria (10) Patent No.: US 7,478,005 B2
(45) Date of Patent: Jan. 13, 2009

(54) TECHNIQUE FOR TESTING INTERCONNECTIONS BETWEEN ELECTRONIC COMPONENTS

(75) Inventor: Victor Echevarria, San Jose, CA (US)

(73) Assignee: Rambus Inc., Los Altos, CA (US)

( * ) Notice: Subject to any disclaimer, the term of this patent is extended or adjusted under 35 U.S.C. 154(b) by 42 days.

(21) Appl. No.: 11/116,244

(22) Filed: Apr. 28, 2005

(65) Prior Publication Data

US 2006/0247886 A1    Nov. 2, 2006

(51) Int. Cl.
G01M 19/00    (2006.01)
(52) U.S. Cl. .................................... 702/122
(58) Field of Classification Search ............... 702/122, 702/117; 710/2; 375/224; 714/713
See application file for complete search history.

(56) References Cited

U.S. PATENT DOCUMENTS

| | | | | |
|---|---|---|---|---|
| 3,909,563 | A * | 9/1975 | Ghosh et al. | ................ 714/713 |
| 5,621,741 | A   | 4/1997 | Kohiyama | |
| 6,208,571 | B1  | 3/2001 | Ikeda et al. | |
| 6,505,317 | B1  | 1/2003 | Smith et al. | |
| 2004/0081234 | A1 * | 4/2004 | Kajita | ....................... 375/224 |
| 2004/0117709 | A1  | 6/2004 | Nejedlo et al. | |
| 2005/0060116 | A1  | 3/2005 | Yeung | |
| 2005/0080581 | A1 * | 4/2005 | Zimmerman et al. | ........ 702/117 |
| 2006/0095592 | A1 * | 5/2006 | Borkenhagen | ................. 710/2 |

FOREIGN PATENT DOCUMENTS

WO    WO 00/39218    8/1999

OTHER PUBLICATIONS

"Command Response Bus System with Inherent Fault-Isolation Features", IBM Technical Disclosure Bulletin, IBM Corp., vol. 29, No. 3, pp. 1144-1148, Aug. 1986.

* cited by examiner

*Primary Examiner*—Tung S Lau
*Assistant Examiner*—Xiuquin Sun
(74) *Attorney, Agent, or Firm*—Hunton & Williams LLP (57) ABSTRACT

A technique for testing interconnections between electronic components is disclosed. In one particular exemplary embodiment, the technique may be realized as a method for testing interconnections between electronic components. The method may comprise sending a command from a test controller to a plurality of electronic components via a first communication path, wherein the command comprises an instruction for one or more of the plurality of electronic components to transmit a recognizable data pattern to the test controller via a second communication path. The method may also comprise isolating a failure in the first communication path based upon the recognizable data pattern not being transmitted to the test controller via the second communication path.

30 Claims, 9 Drawing Sheets

TECHNIQUE FOR TESTING INTERCONNECTIONS BETWEEN ELECTRONIC COMPONENTS

FIELD OF THE DISCLOSURE

The present disclosure relates generally to testing electronic systems and, more particularly, to a technique for testing interconnections between electronic components.

BACKGROUND OF THE DISCLOSURE

In the manufacturing of electronic equipment, it is beneficial to test the proper operation of the manufactured electronic equipment in order to maintain an expected level of quality. Testing may be performed on individual electronic components, subsystems, and complete systems. The testing of subsystems and systems typically involves testing interconnections between electronic components. However, problems may be encountered when trying to perform such testing.

For example, testing of subsystems and systems typically requires that there be two-way communication between a test controller and one or more electronic components to be tested. By connecting a test controller and multiple electronic components together in a serial chain, the test controller may communicate with (e.g., test) each of the multiple electronic components without requiring a large number of interface connections on either the test controller or the multiple electronic components. However, if a break occurs at some point along the serial chain, the test controller will not be able to communicate with (e.g., test) any electronic components that are located on the opposite side of the break from the test controller. In such a case, the test controller will typically not be able to easily isolate the fault (i.e., the break), and thus more extensive testing may be required, which can be labor-intensive, time-consuming, and expensive.

One solution to the above-described fault isolation problem was developed by the Joint Test Action Group (JTAG) and is described in Institute of Electrical and Electronic Engineers (IEEE) Standard 1149.1 (IEEE Standard Test Access Port and Boundary-Scan Architecture). That is, IEEE Standard 1149.1 describes test logic that can be included in integrated circuits to provide standardized approaches to testing interconnections between integrated circuits after they have been assembled on a printed circuit board (PCB), and testing the integrated circuits themselves. The test logic includes a boundary-scan register and other building blocks and is serially accessed through a dedicated multi-pin test access port (TAP).

While IEEE Standard 1149.1 describes a fairly robust solution to the above-described fault isolation problem, it also results in significant increases in die area, pad loading, and pin count. Also, as data rates increase, boundary-scan register loads in accordance with IEEE Standard 1149.1 become very impractical. Furthermore, other methods (e.g., write/read comparison, calibration, wire test, etc.) already exist to test high-speed links in a system.

In view of the foregoing, it would be desirable to provide a technique for testing interconnections between electronic components which overcomes the above-described inadequacies and shortcomings.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENTS

A technique for testing interconnections between electronic components is disclosed. In one particular exemplary embodiment, the technique may be realized as a method for testing interconnections between electronic components. The method may comprise sending a command from a test controller to a plurality of electronic components via a first communication path, wherein the command comprises an instruction for one or more of the plurality of electronic components to transmit a recognizable data pattern to the test controller via a second communication path, wherein the first communication path operates at a first signal transfer rate, wherein the second communication path operates at a second signal transfer rate, and wherein the first signal transfer rate is lower than the second signal transfer rate. The method may also comprise isolating a failure in the first communication path based upon the recognizable data pattern not being transmitted to the test controller via the second communication path.

In another particular exemplary embodiment, the technique may be realized as an apparatus for testing interconnections between electronic components. The apparatus may comprise means for sending a command from a test controller to a plurality of electronic components via a first communication path, wherein the command comprises an instruction for one or more of the plurality of electronic components to transmit a recognizable data pattern to the test controller via a second communication path, wherein the first communication path operates at a first signal transfer rate, wherein the second communication path operates at a second signal transfer rate, and wherein the first signal transfer rate is lower than the second signal transfer rate. The apparatus may also comprise means for isolating a failure in the first communication path based upon the recognizable data pattern not being transmitted to the test controller via the second communication path.

In yet another particular exemplary embodiment, the technique may be realized as a method for testing device-to-device interconnects. The method may comprise sending a test command signal from a controller to a plurality of electronic components via a serial communication path. The method may also comprise transmitting, from each of the plurality of electronic devices that receives the test command signal, a recognizable data pattern to the controller via a second communication path. The method may further comprise receiving the recognizable data patterns at the controller from the plurality of electronic components. The method may additionally comprise verifying the operation of the serial communication path based upon the received recognizable data patterns.

In still another particular exemplary embodiment, the technique may be realized as an apparatus for testing device-to-device interconnects. The apparatus may comprise means for sending a test command signal from a controller to a plurality of electronic components via a serial communication path. The apparatus may also comprise means for transmitting, from each of the plurality of electronic devices that receives the test command signal, a recognizable data pattern to the controller via a second communication path. The apparatus may further comprise means for receiving the recognizable data patterns at the controller from the plurality of electronic components. The apparatus may additionally comprise means for verifying the operation of the serial communication path based upon the received recognizable data patterns.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

Figure 1A:
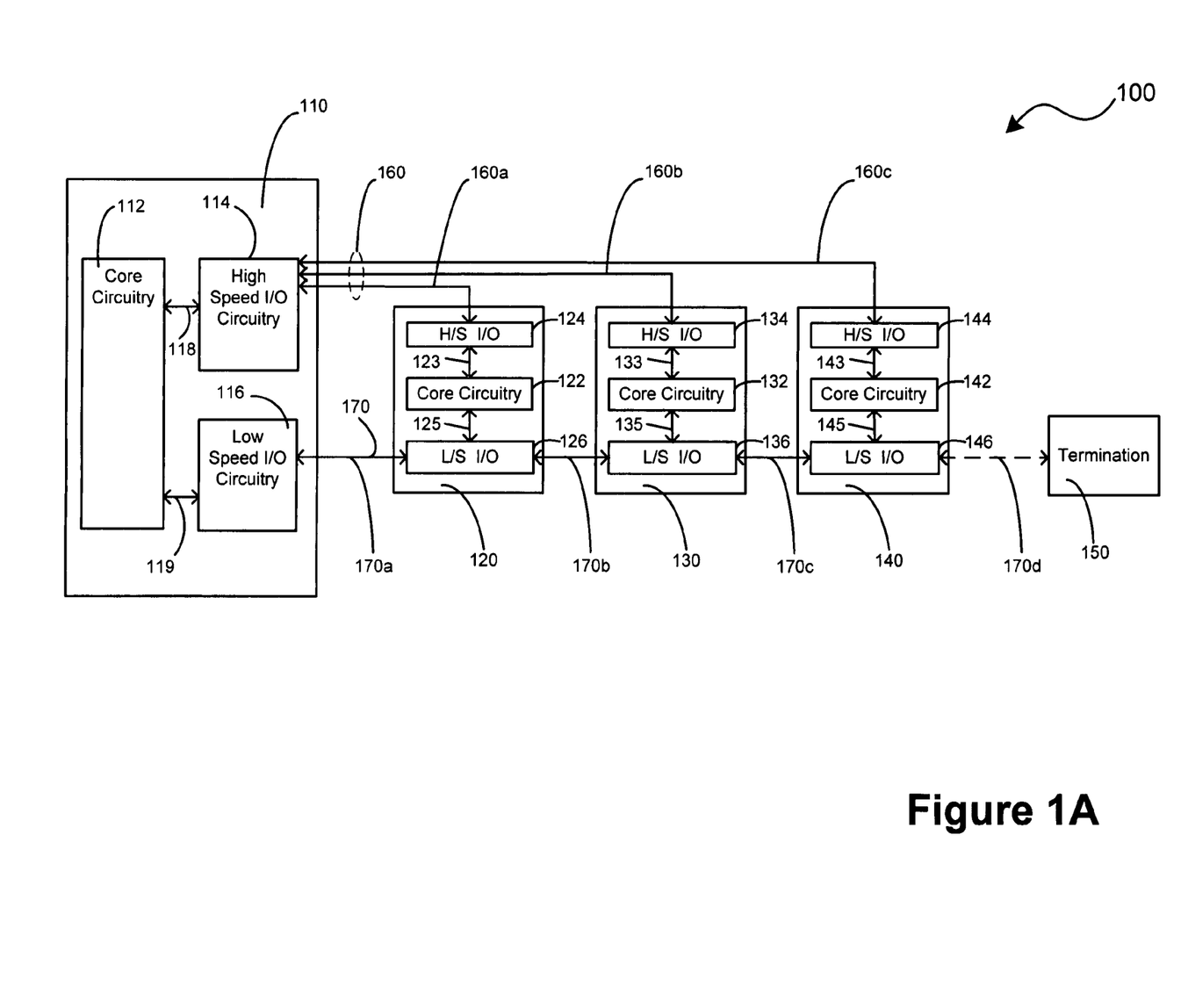
FIG. 1A shows a system for testing interconnections between electronic components in accordance with an embodiment of the present disclosure.

Referring to FIG. 1A, there is shown a system 100 for testing interconnections between electronic components in accordance with an embodiment of the present disclosure. The system 100 comprises a test controller 110 and a plurality of electronic components 120, 130, and 140. The test controller 110 comprises core circuitry 112, high speed input/output (I/O) circuitry 114, and low speed I/O circuitry 116. The core circuitry 112 communicates with the high speed I/O circuitry 114 via a communication path 118. The core circuitry 112 communicates with the low speed I/O circuitry 116 via a communication path 119.

A first electronic component 120 comprises core circuitry 122, high speed I/O circuitry 124, and low speed I/O circuitry 126. The core circuitry 122 communicates with the high speed I/O circuitry 124 via a communication path 123. The core circuitry 122 communicates with the low speed I/O circuitry 126 via a communication path 125.

A second electronic component 130 comprises core circuitry 132, high speed I/O circuitry 134, and low speed I/O circuitry 136. The core circuitry 132 communicates with the high speed I/O circuitry 134 via a communication path 133. The core circuitry 132 communicates with the low speed I/O circuitry 136 via a communication path 135.

A third electronic component 140 comprises core circuitry 142, high speed I/O circuitry 144, and low speed I/O circuitry 146. The core circuitry 142 communicates with the high speed I/O circuitry 144 via a communication path 143. The core circuitry 142 communicates with the low speed I/O circuitry 146 via a communication path 145.

At this point it should be noted that, although system 100 includes only the first electronic component 120, the second electronic component 130, and the third electronic component 140, any number of electronic components may be included in accordance with other embodiments of the present disclosure.

The test controller 110 communicates with the plurality of electronic components 120, 130, and 140 via a high speed communication path 160 that links the test controller 110 to the first electronic component 120 via a high speed communication path portion 160a, links the test controller 110 to the second electronic component 130 via a high speed communication path portion 160b, and links the test controller 110 to the third electronic component 140 via a high speed communication path portion 160c.

At this point it should be noted that, in at least one embodiment, the test controller 110 may be a memory controller and the plurality of electronic components 120, 130, and 140 may be a plurality of memory devices. It should also be noted that, in at least one embodiment, the high speed communication path 160 may comprise high speed parallel control and/or data busses for transferring control and/or data signals at high speeds between the test controller 110 and the plurality of electronic components 120, 130, and 140. It should further be noted that, although FIG. 1A shows the high speed communication path portions 160a, 160b, and 160c as being separate, in at least one embodiment they may be combined into one or more common high speed communication paths.

The test controller 110 also communicates with the plurality of electronic components 120, 130, and 140 via a low speed communication path 170 that serially links the test controller 110 to the first electronic component 120 via a low speed communication path portion 170a, serially links the first electronic component 120 to the second electronic component 130 via a low speed communication path portion 170b, and serially links the second electronic component 130 to the third electronic component 140 via a low speed communication path portion 170c.

At this point it should be noted that, in at least one embodiment, the low speed communication path 170 may comprise a low speed unidirectional or bidirectional (bidirectional shown in system 100) control and/or data serial link for transferring control and/or data signals at low speeds between the test controller 110 and the plurality of electronic components 120, 130, and 140. It should also be noted that the low speed communication path 170 may optionally comprise a low speed communication path portion 170d that serially links the third electronic component 140 to a termination device 150 for terminating the low speed communication path 170.

In accordance with at least one embodiment, the low speed communication path 170, in combination with the test controller 110 and the high speed communication path 160, may be used to test the plurality of electronic components 120, 130, and 140, as well as the individual low speed communication path portions 170a, 170b, 170c, and 170d. That is, the test controller 110 may send a command to one or more of the plurality of electronic components 120, 130, and 140 via the low speed communication path 170. The command may instruct one or more of the plurality of electronic components 120, 130, and 140 to transmit a data pattern back to the test controller 110 via the high speed communication path 160. The command may be a single command directed to one or more of the plurality of electronic components 120, 130, and 140, or a plurality of commands directed to one or more of the plurality of electronic components 120, 130, and 140. The data pattern may be any data pattern that is recognizable by the test controller 110 as originating from one or more of the plurality of electronic components 120, 130, and 140. A data pattern that is transmitted from any one of the plurality of electronic components 120, 130, and 140 may be transmitted either separately from or simultaneously with a data pattern that is transmitted from any other one(s) of the plurality of electronic components 120, 130, and 140.

If the test controller 110 fails to receive an expected data pattern from one of the plurality of electronic components 120, 130, and 140 via the high speed communication path 160 in response to a command to transmit such a data pattern, the test controller 110 may determine that a failure has occurred in the system 100. Such a failure may be the result of a failure of the high speed communication path 160, the low speed communication path 170, or one or more of the plurality of electronic components 120, 130, and 140. Assuming that the high speed communication path 160 and the plurality of electronic components 120, 130, and 140 (or at least those portions thereof which are associated with high speed communications) have been previously tested by other methods and/or means and have been determined to be in good working order, which would often be the case, the test controller 110 may safely determine that a failure has occurred in the low speed communication path 170 or those portions of the plurality of electronic components 120, 130, and 140 which are associated with low speed communications.

Figure 1B:
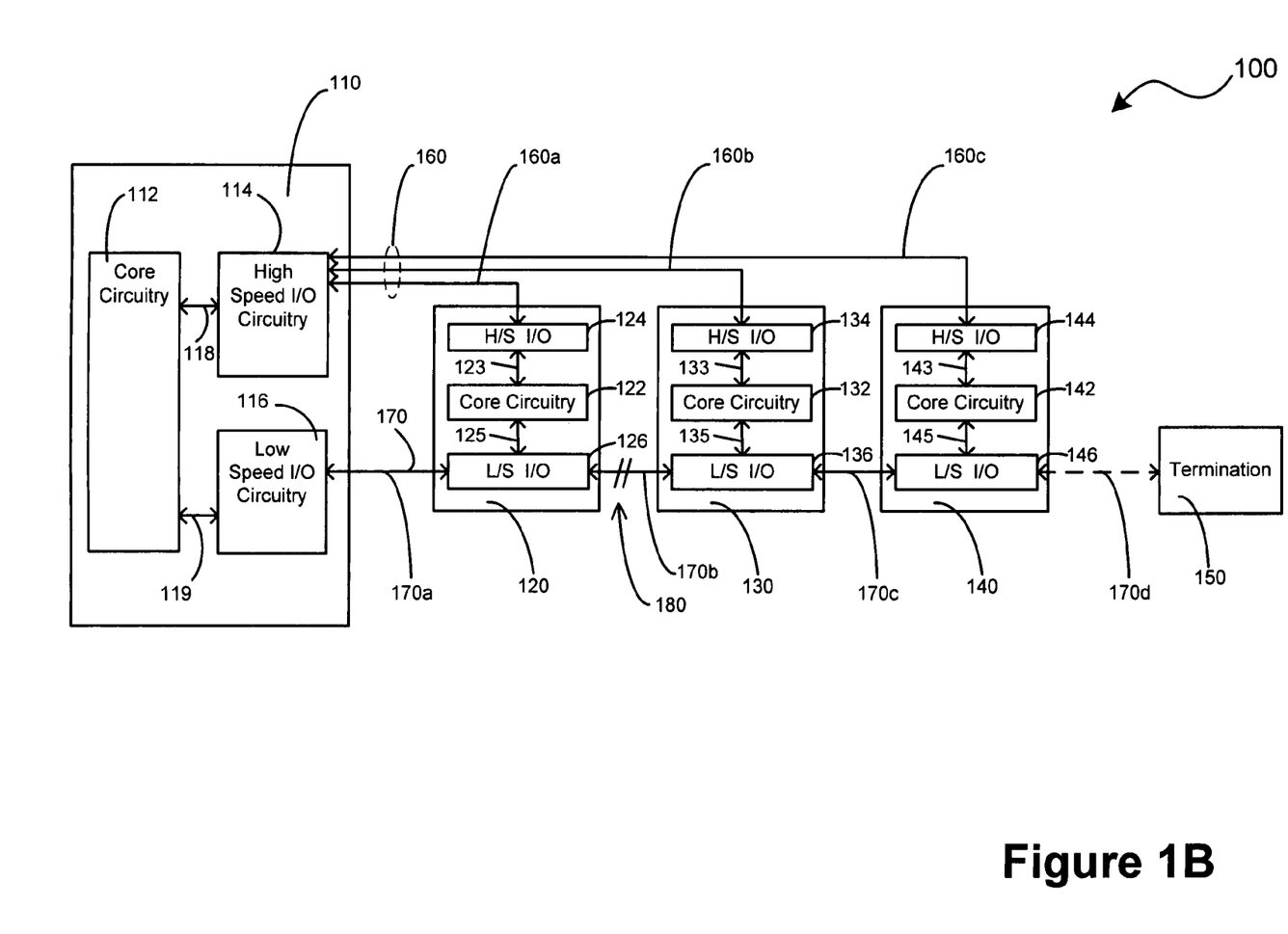
FIG. 1B shows the system of FIG. 1A having a fault in accordance with an embodiment of the present disclosure.

For example, referring to FIG. 1B, if a failure 180 has occurred in the low speed communication path 170 in low speed communication path portion 170b, then only the first electronic component 120 would receive commands from the test controller 110, and the second and third electronic components 130 and 140 would not receive commands from the test controller 110. Accordingly, if the test controller 110 fails to receive an expected data pattern from the second and third electronic components 130 and 140 via the high speed communication path 160 in response to a command to transmit such a data pattern, then the test controller 110 may determine that a failure has occurred in the low speed communication path 170 in low speed communication path portion 170b, or in either an output portion of the low speed I/O circuitry 126 or an input portion of the low speed I/O circuitry 136. If both the first and second electronic components 120 and 130 were tested prior to being connected in the system 100, which would often be the case, the test controller 110 may then determine that the failure 180 has occurred in the low speed communication path 170 in low speed communication path portion 170b, thereby isolating the failure 180 in the system 100. Such fault isolation alleviates the need for more extensive testing, which can be labor-intensive, time-consuming, and expensive.

At this point it should be noted that, in at least one embodiment, the high speed communication path 160 may operate at a signal transfer rate of about 3.2 GHz, and the low speed communication path 170 may operate at a signal transfer rate of about 50 MHz. It should also be noted, however, that the present disclosure is not limited in this regard. That is, the high speed communication path 160 and the low speed communication path 170 may each operate at a variety of signal transfer rates, with the only limitation being that the high speed communication path 160 operate at a higher signal transfer rate than the low speed communication path 170.

Figure 2A:
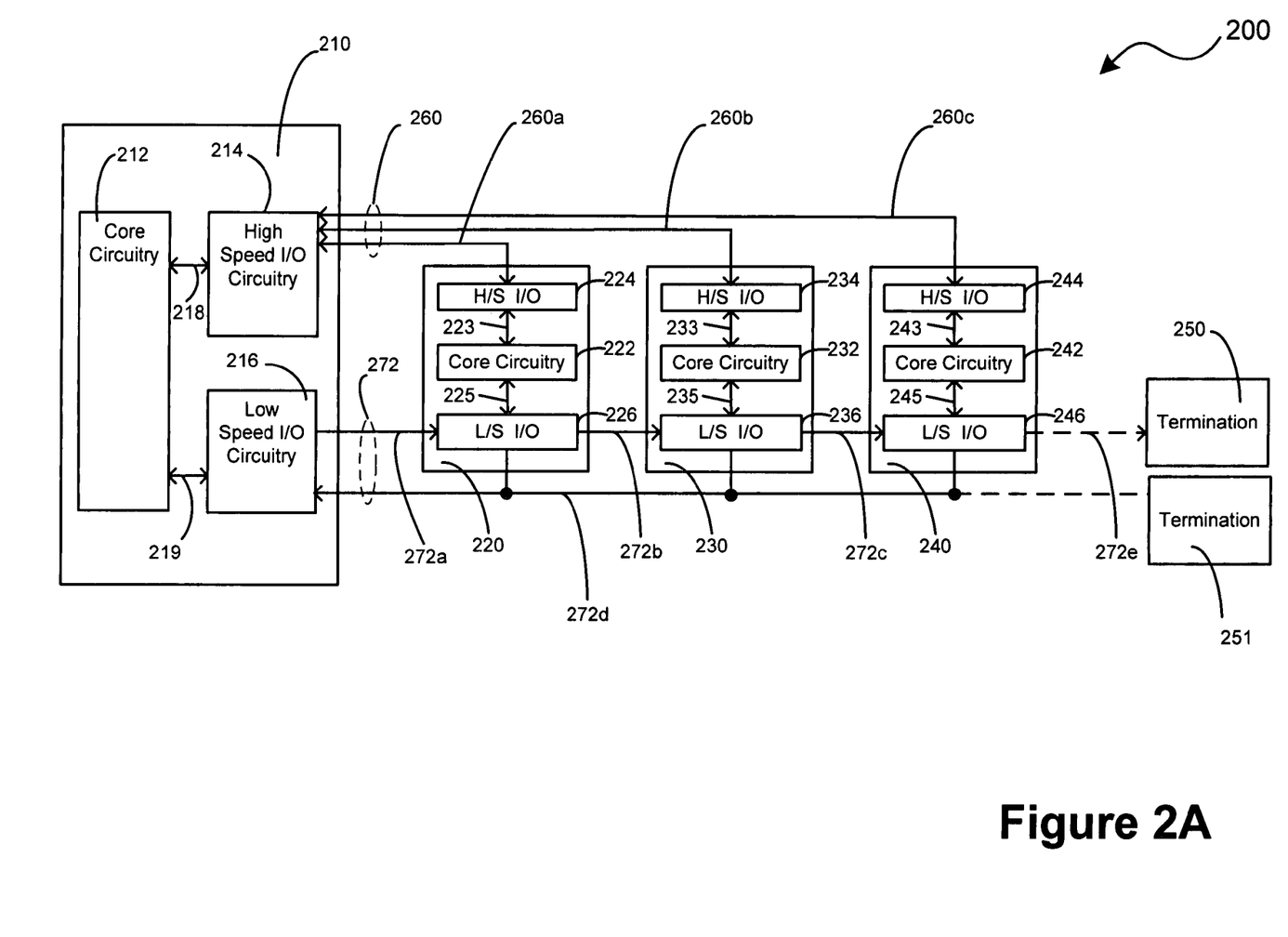
FIG. 2A shows a system for testing interconnections between electronic components in accordance with an alternative embodiment of the present disclosure.

Referring to FIG. 2A, there is shown a system 200 for testing interconnections between electronic components in accordance with an alternative embodiment of the present disclosure. The system 200 comprises a test controller 210 and a plurality of electronic components 220, 230, and 240.

The test controller 210 comprises core circuitry 212, high speed input/output (I/O) circuitry 214, and low speed I/O circuitry 216. The core circuitry 212 communicates with the high speed I/O circuitry 214 via a communication path 218. The core circuitry 212 communicates with the low speed I/O circuitry 216 via a communication path 219.

A first electronic component 220 comprises core circuitry 222, high speed I/O circuitry 224, and low speed I/O circuitry 226. The core circuitry 222 communicates with the high speed I/O circuitry 224 via a communication path 223. The core circuitry 222 communicates with the low speed I/O circuitry 226 via a communication path 225.

A second electronic component 230 comprises core circuitry 232, high speed I/O circuitry 234, and low speed I/O circuitry 236. The core circuitry 232 communicates with the high speed I/O circuitry 234 via a communication path 233. The core circuitry 232 communicates with the low speed I/O circuitry 236 via a communication path 235.

A third electronic component 240 comprises core circuitry 242, high speed I/O circuitry 244, and low speed I/O circuitry 246. The core circuitry 242 communicates with the high speed I/O circuitry 244 via a communication path 243. The core circuitry 242 communicates with the low speed I/O circuitry 246 via a communication path 245.

At this point it should be noted that, although system 200 includes only the first electronic component 220, the second electronic component 230, and the third electronic component 240, any number of electronic components may be included in accordance with other embodiments of the present disclosure.

The test controller 210 communicates with the plurality of electronic components 220, 230, and 240 via a high speed communication path 260 that links the test controller 210 to the first electronic component 220 via a high speed communication path portion 260a, links the test controller 210 to the second electronic component 230 via a high speed communication path portion 260b, and links the test controller 210 to the third electronic component 240 via a high speed communication path portion 260c.

At this point it should be noted that, in at least one embodiment, the test controller 210 may be a memory controller and the plurality of electronic components 220, 230, and 240 may be a plurality of memory devices. It should also be noted that, in at least one embodiment, the high speed communication path 260 may comprise high speed parallel control and/or data busses for transferring control and/or data signals at high speeds between the test controller 210 and the plurality of electronic components 220, 230, and 240. It should further be noted that, although FIG. 2A shows the high speed communication path portions 260a, 260b, and 260c as being separate, in at least one embodiment they may be combined into one or more common high speed communication paths.

The test controller 210 also communicates with the plurality of electronic components 220, 230, and 240 via a low speed communication path 272 that serially links the test controller 210 to the first electronic component 220 in a transmit direction via a low speed communication path portion 272a, serially links the first electronic component 220 to the second electronic component 230 in a transmit direction via a low speed communication path portion 272b, serially links the second electronic component 230 to the third electronic component 240 in a transmit direction via a low speed communication path portion 272c, and busses each of the plurality of electronic components 220, 230, and 240 to the test controller 210 in a receive direction via a low speed communication path portion 272d.

At this point it should be noted that, in at least one embodiment, the low speed communication path 272 may comprise a low speed unidirectional control and/or data transmit serial link for transferring control and/or data signals at low speeds from the test controller 210 to the plurality of electronic components 220, 230, and 240, as well as a low speed unidirectional control and/or data receive bus for transferring control and/or data signals at low speeds from the plurality of electronic components 220, 230, and 240 to the test controller 210. It should also be noted that the low speed communication path 272 may optionally comprise a low speed communication path portion 272e that serially links the third electronic component 240 to a termination device 250 for terminating the low speed communication path portion 272e. It should further be noted that the low speed communication path portion 272d may optionally be connected to a termination device 251 for terminating the low speed communication path portion 272d.

In accordance with at least one embodiment, the low speed communication path 272, in combination with the test controller 210 and the high speed communication path 260, may be used to test the plurality of electronic components 220, 230, and 240, as well as the individual low speed communication path portions 272a, 272b, 272c, 272d, and 272e. That is, the test controller 210 may send a command to one or more of the plurality of electronic components 220, 230, and 240 via the low speed communication path 272. The command may instruct one or more of the plurality of electronic components 220, 230, and 240 to transmit a data pattern back to the test controller 210 via the high speed communication path 260. The command may be a single command directed to one or more of the plurality of electronic components 220, 230, and 240, or a plurality of commands directed to one or more of the plurality of electronic components 220, 230, and 240. The data pattern may be any data pattern that is recognizable by the test controller 210 as originating from one or more of the plurality of electronic components 220, 230, and 240. A data pattern that is transmitted from any one of the plurality of electronic components 220, 230, and 240 may be transmitted either separately from or simultaneously with a data pattern that is transmitted from any other one(s) of the plurality of electronic components 220, 230, and 240.

If the test controller 210 fails to receive an expected data pattern from one of the plurality of electronic components 220, 230, and 240 via the high speed communication path 260 in response to a command to transmit such a data pattern, the test controller 210 may determine that a failure has occurred in the system 200. Such a failure may be the result of a failure of the high speed communication path 260, the low speed communication path 272, or one or more of the plurality of electronic components 220, 230, and 240. Assuming that the high speed communication path 260 and the plurality of electronic components 220, 230, and 240 (or at least those portions thereof which are associated with high speed communications) have been previously tested by other methods and/or means and have been determined to be in good working order, which would often be the case, the test controller 210 may safely determine that a failure has occurred in the low speed communication path 272 or those portions of the plurality of electronic components 220, 230, and 240 which are associated with low speed communications.

Figure 2B:
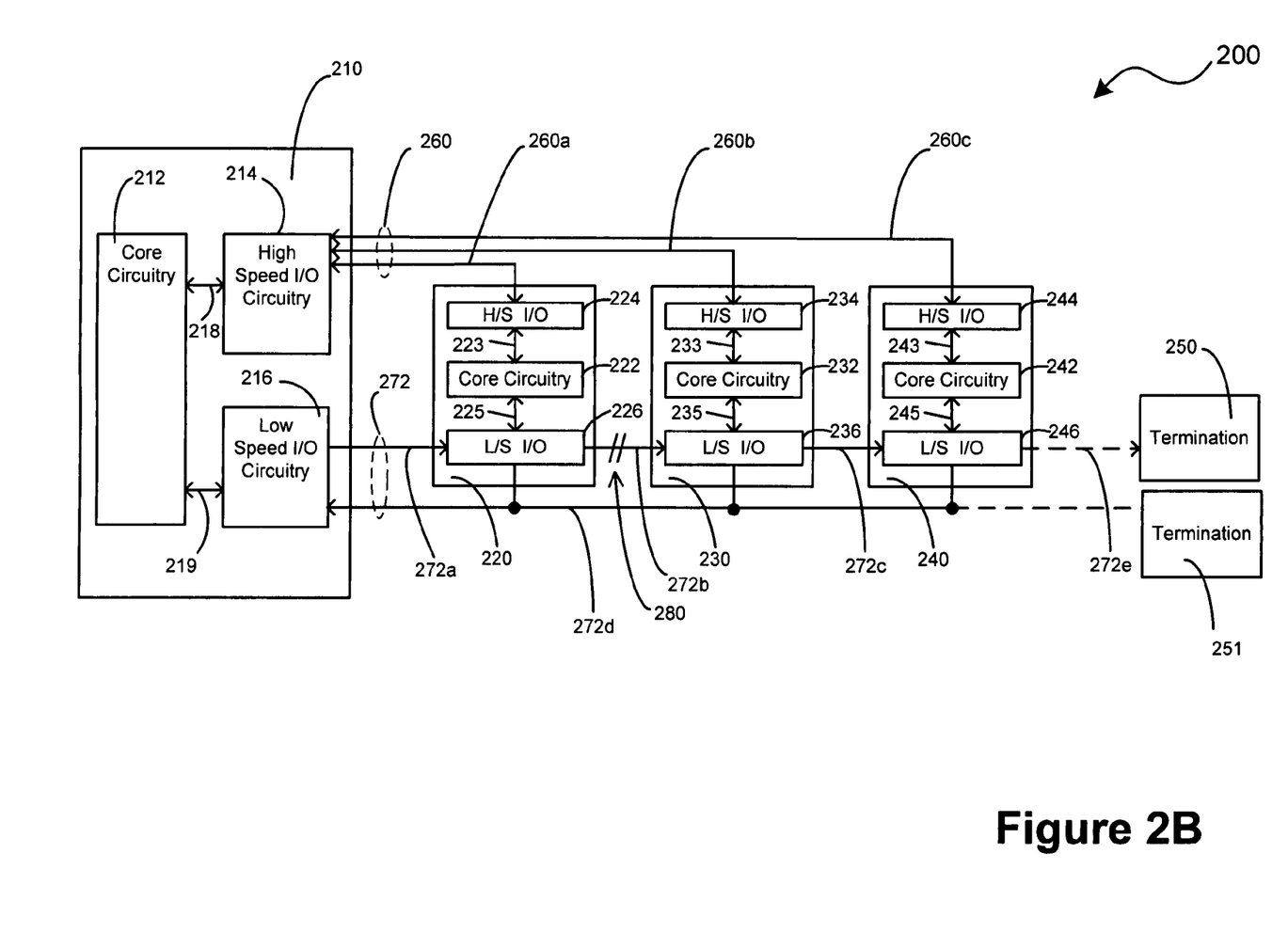
FIG. 2B shows the system of FIG. 2A having a fault in accordance with an alternative embodiment of the present disclosure.

For example, referring to FIG. 2B, if a failure 280 has occurred in the low speed communication path 272 in low speed communication path portion 272b, then only the first electronic component 220 would receive commands from the test controller 210, and the second and third electronic components 230 and 240 would not receive commands from the test controller 210. Accordingly, if the test controller 210 fails to receive an expected data pattern from the second and third electronic components 230 and 240 via the high speed communication path 260 in response to a command to transmit such a data pattern, then the test controller 210 may determine that a failure has occurred in the low speed communication path 272 in low speed communication path portion 272b, or in either an output portion of the low speed I/O circuitry 226 or an input portion of the low speed I/O circuitry 236. If both the first and second electronic components 220 and 230 were tested prior to being connected in the system 200, which would often be the case, the test controller 210 may then determine that the failure 280 has occurred in the low speed communication path 272 in low speed communication path portion 272b, thereby isolating the failure 280 in the system 200. Such fault isolation alleviates the need for more extensive testing, which can be labor-intensive, time-consuming, and expensive.

At this point it should be noted that, in at least one embodiment, the high speed communication path 260 may operate at a signal transfer rate of about 3.2 GHz, and the low speed communication path 272 may operate at a signal transfer rate of about 50 MHz. It should also be noted, however, that the present disclosure is not limited in this regard. That is, the high speed communication path 260 and the low speed communication path 272 may each operate at a variety of signal transfer rates, with the only limitation being that the high speed communication path 260 operate at a higher signal transfer rate than the low speed communication path 272.

Figure 3A:
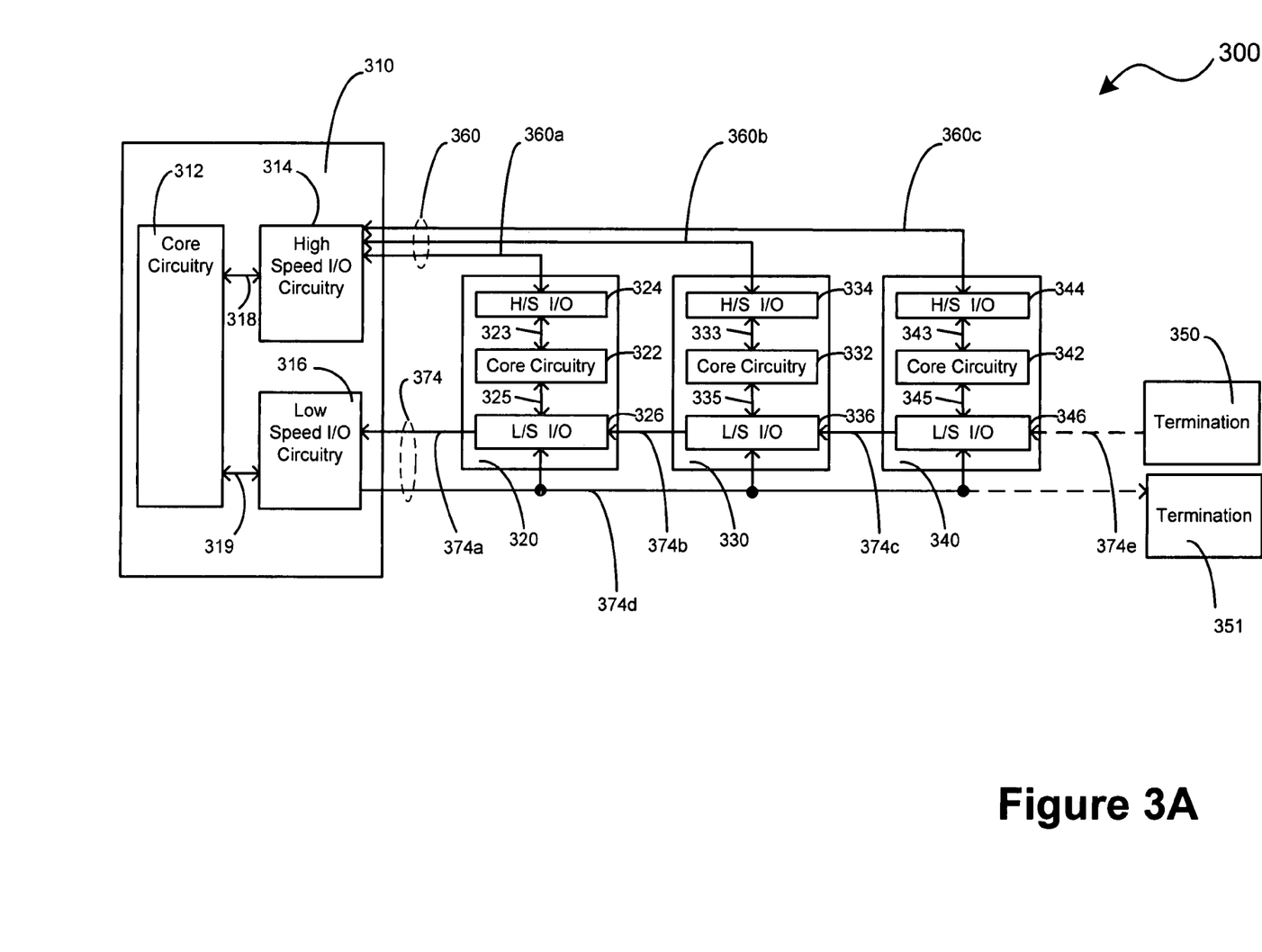
FIG. 3A shows a system for testing interconnections between electronic components in accordance with another alternative embodiment of the present disclosure.

Referring to FIG. 3A, there is shown a system 300 for testing interconnections between electronic components in accordance with another alternative embodiment of the present disclosure. The system 300 comprises a test controller 310 and a plurality of electronic components 320, 330, and 340. The test controller 310 comprises core circuitry 312, high speed input/output (I/O) circuitry 314, and low speed I/O circuitry 316. The core circuitry 312 communicates with the high speed I/O circuitry 314 via a communication path 318. The core circuitry 312 communicates with the low speed I/O circuitry 316 via a communication path 319.

A first electronic component 320 comprises core circuitry 322, high speed I/O circuitry 324, and low speed I/O circuitry 326. The core circuitry 322 communicates with the high speed I/O circuitry 324 via a communication path 323. The core circuitry 322 communicates with the low speed I/O circuitry 326 via a communication path 325.

A second electronic component 330 comprises core circuitry 332, high speed I/O circuitry 334, and low speed I/O circuitry 336. The core circuitry 332 communicates with the high speed I/O circuitry 334 via a communication path 333. The core circuitry 332 communicates with the low speed I/O circuitry 336 via a communication path 335.

A third electronic component 340 comprises core circuitry 342, high speed I/O circuitry 344, and low speed I/O circuitry 346. The core circuitry 342 communicates with the high speed I/O circuitry 344 via a communication path 343. The core circuitry 342 communicates with the low speed I/O circuitry 346 via a communication path 345.

At this point it should be noted that, although system 300 includes only the first electronic component 320, the second electronic component 330, and the third electronic component 340, any number of electronic components may be included in accordance with other embodiments of the present disclosure.

The test controller 310 communicates with the plurality of electronic components 320, 330, and 340 via a high speed communication path 360 that links the test controller 310 to the first electronic component 320 via a high speed communication path portion 360a, links the test controller 310 to the second electronic component 330 via a high speed communication path portion 360b, and links the test controller 310 to the third electronic component 340 via a high speed communication path portion 360c.

At this point it should be noted that, in at least one embodiment, the test controller 310 may be a memory controller and the plurality of electronic components 320, 330, and 340 may be a plurality of memory devices. It should also be noted that, in at least one embodiment, the high speed communication path 360 may comprise high speed parallel control and/or data busses for transferring control and/or data signals at high speeds between the test controller 310 and the plurality of electronic components 320, 330, and 340. It should further be noted that, although FIG. 3A shows the high speed communication path portions 360a, 360b, and 360c as being separate, in at least one embodiment they may be combined into one or more common high speed communication paths.

The test controller 310 also communicates with the plurality of electronic components 320, 330, and 340 via a low speed communication path 374 that serially links the first electronic component 320 to the test controller 310 in a receive direction via a low speed communication path portion 374a, serially links the second electronic component 330 to the first electronic component 320 in a receive direction via a low speed communication path portion 374b, serially links the third electronic component 340 to the second electronic component 330 in a receive direction via a low speed communication path portion 374c, and busses the test controller 310 to each of the plurality of electronic components 320, 330, and 340 in a transmit direction via a low speed communication path portion 374d.

At this point it should be noted that, in at least one embodiment, the low speed communication path 374 may comprise a low speed unidirectional control and/or data transmit bus for transferring control and/or data signals at low speeds from the test controller 310 to the plurality of electronic components 320, 330, and 340, as well as a low speed unidirectional control and/or data receive serial link for transferring control and/or data signals at low speeds from the plurality of electronic components 320, 330, and 340 to the test controller 310. It should also be noted that the low speed communication path 374 may optionally comprise a low speed communication path portion 374e that serially links a termination device 350 to the third electronic component 340 for terminating the low speed communication path portion 374e. It should further be noted that the low speed communication path portion 374d may optionally be connected to a termination device 351 for terminating the low speed communication path portion 374d.

In accordance with at least one embodiment, the low speed communication path 374, in combination with the test controller 310 and the high speed communication path 360, may be used to test the plurality of electronic components 320, 330, and 340, as well as the individual low speed communication path portions 374a, 374b, 374c, 374d, and 374e. That is, the test controller 310 may send a command to one or more of the plurality of electronic components 320, 330, and 340 via the low speed communication path portion 374d. The command may instruct one or more of the plurality of electronic components 320, 330, and 340 to transmit a data pattern back to the test controller 310 via the high speed communication path 360. The command may be a single command directed to one or more of the plurality of electronic components 320, 330, and 340, or a plurality of commands directed to one or more of the plurality of electronic components 320, 330, and 340. The data pattern may be any data pattern that is recognizable by the test controller 310 as originating from one or more of the plurality of electronic components 320, 330, and 340. A data pattern that is transmitted from any one of the plurality of electronic components 320, 330, and 340 may be transmitted either separately from or simultaneously with a data pattern that is transmitted from any other one(s) of the plurality of electronic components 320, 330, and 340.

At this point it should be noted that each of the plurality of electronic components 320, 330, and 340 may be assigned a unique identifier according to its location within the system 300. For example, assume that each of the plurality of electronic components 320, 330, and 340 has a weak internal pull-up on an input portion of its low speed I/O circuitry, and that each of the plurality of electronic components 320, 330, and 340 has an internal pull-down on an output portion of its low speed I/O circuitry. Thus, the third electronic component 340 may be assigned a unique identifier of "1" by having termination device 350 pull up (e.g., to a high logic level) low speed communication path portion 374e during initialization of the system 300. The first and second electronic components 320 and 330 would not be assigned a unique identifier of "1" since low speed communication path portions 374b and 374c would not be pulled-up to a high logic level. The third electronic component 340 may then indicate to the second electronic component 330 via low speed communication path portion 374c that it has been assigned unique identifier of "1" and thus the second electronic component 330 may be assigned unique identifier of "2". This process may then continue until each of the plurality of electronic components 320, 330, and 340 has been assigned a unique identifier. The test controller 310 may then send individual commands to each of the plurality of electronic components 320, 330, and 340 via the low speed communication path portion 374d.

If the test controller 310 fails to receive an expected data pattern from one of the plurality of electronic components 320, 330, and 340 via the high speed communication path 360 in response to a command to transmit such a data pattern, the test controller 310 may determine that a failure has occurred in the system 300. Such a failure may be the result of a failure of the high speed communication path 360, the low speed communication path 374, or one or more of the plurality of electronic components 320, 330, and 340. Assuming that the high speed communication path 360 and the plurality of electronic components 320, 330, and 340 (or at least those portions thereof which are associated with high speed communications) have been previously tested by other methods and/or means and have been determined to be in good working order, which would often be the case, the test controller 310 may safely determine that a failure has occurred in the low speed communication path 374 or those portions of the plurality of electronic components 320, 330, and 340 which are associated with low speed communications.

Figure 3B:
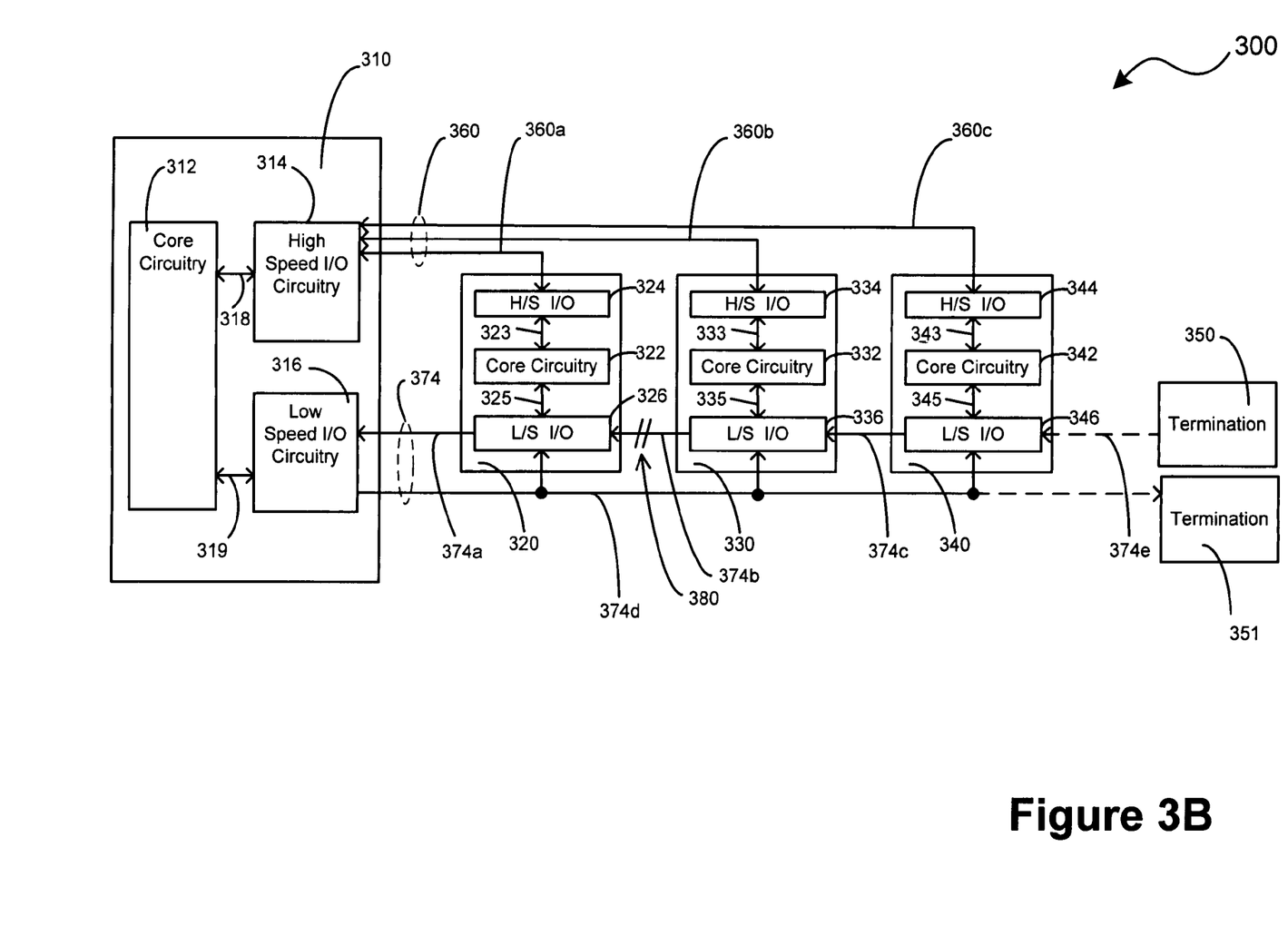
FIG. 3B shows the system of FIG. 3A having a fault in accordance with another alternative embodiment of the present disclosure.

For example, referring to FIG. 3B, if a failure 380 has occurred in the low speed communication path 374 in low speed communication path portion 374b, then the first electronic component 320 would incorrectly be assigned unique identifier of "1" because the weak internal pull-up on the input portion of low speed I/O circuitry 326 would pull up (e.g., to a high logic level) the portion of low speed communication path portion 374b connected to the first electronic component 320 during initialization of the system 300. The first electronic component 320 would then incorrectly transmit an unexpected data pattern when the test controller 310 sends an individual command to the electronic component associated with unique identifier of "1". The test controller 310 may then determine that a failure has occurred in the low speed communication path 374 in low speed communication path portion 374b, or in either an output portion of the low speed I/O circuitry 326 or an input portion of the low speed I/O circuitry 336. If both the first and second electronic components 320 and 330 were tested prior to being connected in the system 300, which would often be the case, the test controller 310 may then determine that the failure 380 has occurred in the low speed communication path 374 in low speed communication path portion 374b, thereby isolating the failure 380 in the system 300. Such fault isolation alleviates the need for more extensive testing, which can be labor-intensive, time-consuming, and expensive.

Figure 3C:
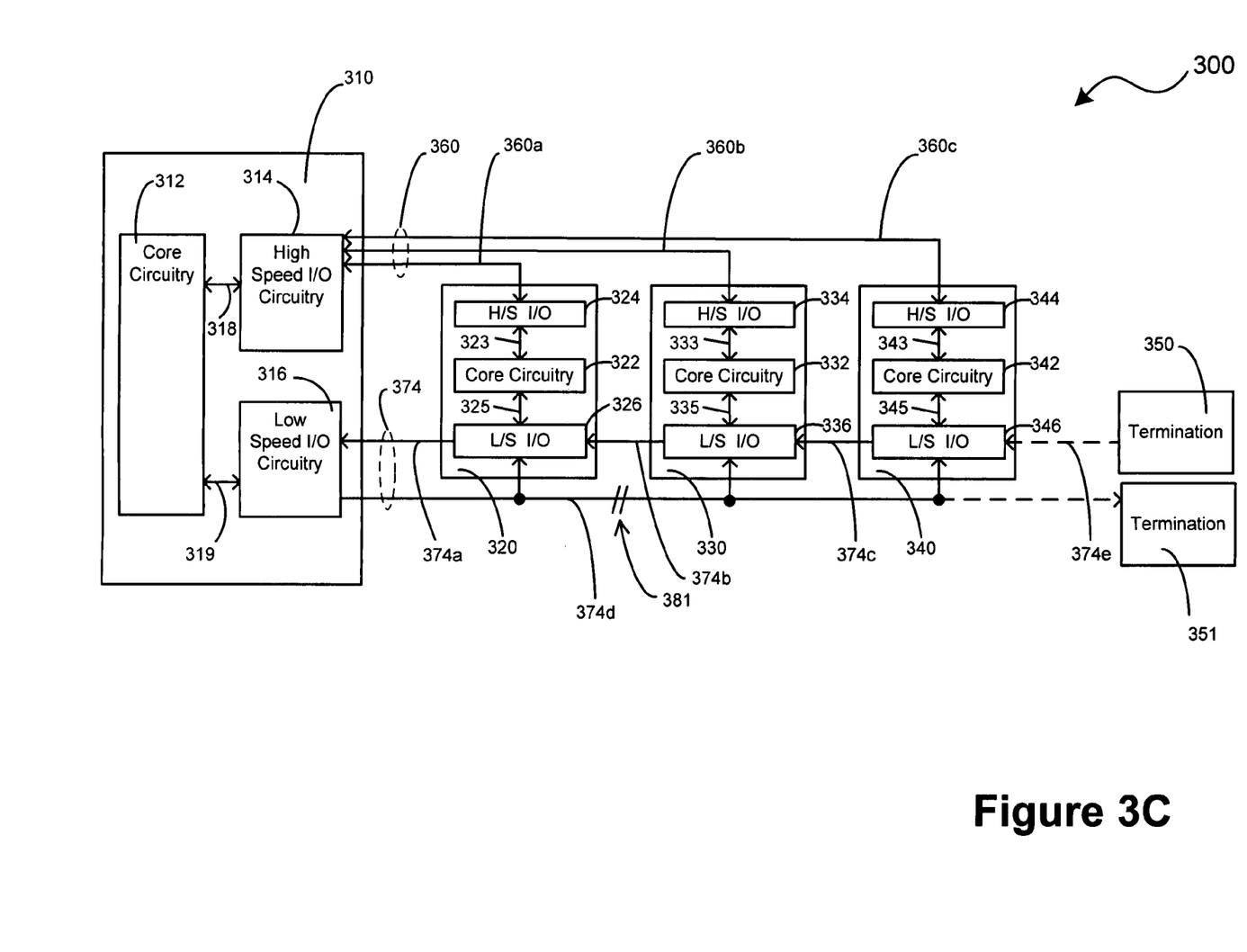
FIG. 3C shows the system of FIG. 3A having another fault in accordance with another alternative embodiment of the present disclosure.

By way of another example, referring to FIG. 3C, if a failure 381 has occurred in the low speed communication path 374 in low speed communication path portion 374d, then only the first electronic component 320 would receive commands from the test controller 310, and the second and third electronic components 330 and 340 would not receive commands from the test controller 310. Accordingly, if the test controller 310 fails to receive an expected data pattern from the second and third electronic components 330 and 340 via the high speed communication path 360 in response to a command to transmit such a data pattern, then the test controller 310 may determine that a failure has occurred in the low speed communication path 374 in low speed communication path portion 374d, or in the second and third electronic components 330 and 340. If both the second and third electronic components 330 and 340 were tested prior to being connected in the system 300, which would often be the case, the test controller 310 may then determine that the failure 381 has occurred in the low speed communication path 374 in low speed communication path portion 374d, thereby isolating the failure 381 in the system 300. Such fault isolation alleviates the need for more extensive testing, which can be labor-intensive, time-consuming, and expensive.

At this point it should be noted that, in at least one embodiment, the high speed communication path 360 may operate at a signal transfer rate of about 3.2 GHz, and the low speed communication path 374 may operate at a signal transfer rate of about 50 MHz. It should also be noted, however, that the present disclosure is not limited in this regard. That is, the high speed communication path 360 and the low speed communication path 374 may each operate at a variety of signal transfer rates, with the only limitation being that the high speed communication path 360 operate at a higher signal transfer rate than the low speed communication path 374.

Figure 4A:
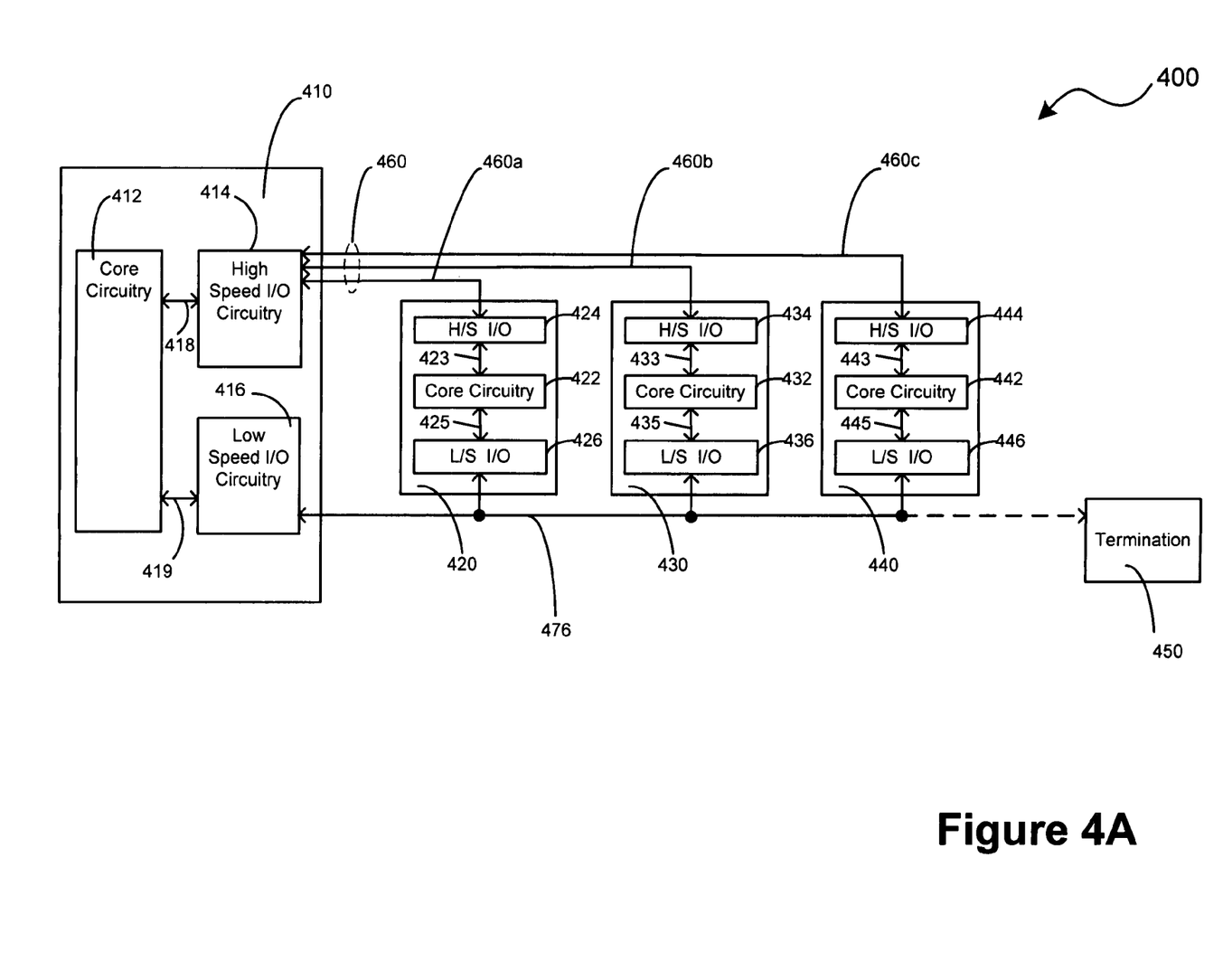
FIG. 4A shows a system for testing interconnections between electronic components in accordance with another alternative embodiment of the present disclosure.

Referring to FIG. 4A, there is shown a system 400 for testing interconnections between electronic components in accordance with another embodiment of the present disclosure. The system 400 comprises a test controller 410 and a plurality of electronic components 420, 430, and 440. The test controller 410 comprises core circuitry 412, high speed input/output (I/O) circuitry 414, and low speed I/O circuitry 416. The core circuitry 412 communicates with the high speed I/O circuitry 414 via a communication path 418. The core circuitry 412 communicates with the low speed I/O circuitry 416 via a communication path 419.

A first electronic component 420 comprises core circuitry 422, high speed I/O circuitry 424, and low speed I/O circuitry 426. The core circuitry 422 communicates with the high speed I/O circuitry 424 via a communication path 423. The core circuitry 422 communicates with the low speed I/O circuitry 426 via a communication path 425.

A second electronic component 430 comprises core circuitry 432, high speed I/O circuitry 434, and low speed I/O circuitry 436. The core circuitry 432 communicates with the high speed I/O circuitry 434 via a communication path 433.

The core circuitry 432 communicates with the low speed I/O circuitry 436 via a communication path 435.

A third electronic component 440 comprises core circuitry 442, high speed I/O circuitry 444, and low speed I/O circuitry 446. The core circuitry 442 communicates with the high speed I/O circuitry 444 via a communication path 443. The core circuitry 442 communicates with the low speed I/O circuitry 446 via a communication path 445.

At this point it should be noted that, although system 400 includes only the first electronic component 420, the second electronic component 430, and the third electronic component 440, any number of electronic components may be included in accordance with other embodiments of the present disclosure.

The test controller 410 communicates with the plurality of electronic components 420, 430, and 440 via a high speed communication path 460 that links the test controller 410 to the first electronic component 420 via a high speed communication path portion 460a, links the test controller 410 to the second electronic component 430 via a high speed communication path portion 460b, and links the test controller 410 to the third electronic component 440 via a high speed communication path portion 460c.

At this point it should be noted that, in at least one embodiment, the test controller 410 may be a memory controller and the plurality of electronic components 420, 430, and 440 may be a plurality of memory devices. It should also be noted that, in at least one embodiment, the high speed communication path 460 may comprise high speed parallel control and/or data busses for transferring control and/or data signals at high speeds between the test controller 410 and the plurality of electronic components 420, 430, and 440. It should further be noted that, although FIG. 4A shows the high speed communication path portions 460a, 460b, and 460c as being separate, in at least one embodiment they may be combined into one or more common high speed communication paths.

The test controller 410 also communicates with the plurality of electronic components 420, 430, and 440 via a low speed communication path 476 that busses between the test controller 410 and the plurality of electronic components 420, 430, and 440.

At this point it should be noted that, in at least one embodiment, the low speed communication path 476 may comprise a low speed unidirectional or bidirectional (bidirectional shown in system 400) control and/or data bus for transferring control and/or data signals at low speeds between the test controller 410 and the plurality of electronic components 420, 430, and 440. It should also be noted that the low speed communication path 476 may optionally be connected to a termination device 450 for terminating the low speed communication path 476.

In accordance with at least one embodiment, the low speed communication path 476, in combination with the test controller 410 and the high speed communication path 460, may be used to test the plurality of electronic components 420, 430, and 440, as well as the low speed communication path 476. That is, the test controller 410 may send a command to one or more of the plurality of electronic components 420, 430, and 440 via the low speed communication path 476. The command may instruct one or more of the plurality of electronic components 420, 430, and 440 to transmit a data pattern back to the test controller 410 via the high speed communication path 460. The command may be a single command directed to one or more of the plurality of electronic components 420, 430, and 440, or a plurality of commands directed to one or more of the plurality of electronic components 420, 430, and 440. The data pattern may be any data pattern that is recognizable by the test controller 410 as originating from one or more of the plurality of electronic components 420, 430, and 440. A data pattern that is transmitted from any one of the plurality of electronic components 420, 430, and 440 may be transmitted either separately from or simultaneously with a data pattern that is transmitted from any other one(s) of the plurality of electronic components 420, 430, and 440.

At this point it should be noted that, in the system 400 shown in FIG. 4A, the low speed communication path 476 may include one or more control lines (e.g., chip select lines) for carrying select signals for individually selecting the plurality of electronic components 420, 430, and 440 when the test controller 410 sends commands to the plurality of electronic components 420, 430, and 440 via the low speed communication path 476.

If the test controller 410 fails to receive an expected data pattern from one of the plurality of electronic components 420, 430, and 440 via the high speed communication path 460 in response to a command to transmit such a data pattern, the test controller 410 may determine that a failure has occurred in the system 400. Such a failure may be the result of a failure of the high speed communication path 460, the low speed communication path 476, or one or more of the plurality of electronic components 420, 430, and 440. Assuming that the high speed communication path 460 and the plurality of electronic components 420, 430, and 440 (or at least those portions thereof which are associated with high speed communications) have been previously tested by other methods and/or means and have been determined to be in good working order, which would often be the case, the test controller 410 may safely determine that a failure has occurred in the low speed communication path 476 or those portions of the plurality of electronic components 420, 430, and 440 which are associated with low speed communications.

Figure 4B:
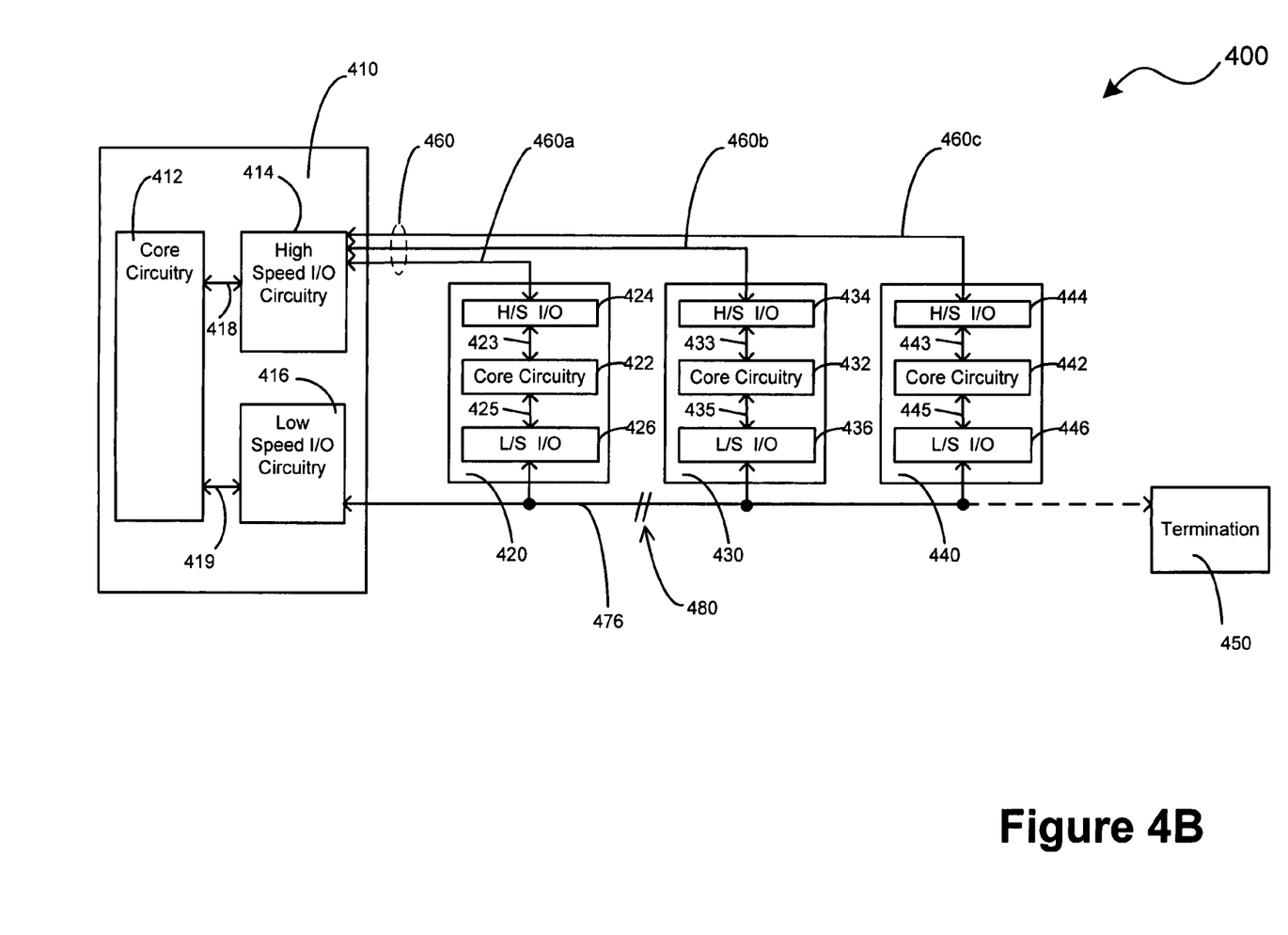
FIG. 4B shows the system of FIG. 4A having a fault in accordance with another alternative embodiment of the present disclosure.

For example, referring to FIG. 4B, if a failure 480 has occurred in the low speed communication path 476, then only the first electronic component 420 would receive commands from the test controller 410, and the second and third electronic components 430 and 440 would not receive commands from the test controller 410. Accordingly, if the test controller 410 fails to receive an expected data pattern from the second and third electronic components 430 and 440 via the high speed communication path 460 in response to a command to transmit such a data pattern, then the test controller 410 may determine that a failure has occurred in the low speed communication path 476, or in the second and third electronic components 430 and 440. If both the second and third electronic components 430 and 440 were tested prior to being connected in the system 400, which would often be the case, the test controller 410 may then determine that the failure 480 has occurred in the low speed communication path 476, thereby isolating the failure 480 in the system 400. Such fault isolation alleviates the need for more extensive testing, which can be labor-intensive, time-consuming, and expensive.

At this point it should be noted that, in at least one embodiment, the high speed communication path 460 may operate at a signal transfer rate of about 3.2 GHz, and the low speed communication path 476 may operate at a signal transfer rate of about 50 MHz. It should also be noted, however, that the present disclosure is not limited in this regard. That is, the high speed communication path 460 and the low speed communication path 476 may each operate at a variety of signal transfer rates, with the only limitation being that the high speed communication path 460 operate at a higher signal transfer rate than the low speed communication path 476.

At this point it should be noted that testing interconnections between electronic components in accordance with the present disclosure as described above typically involves the processing of input data and the generation of output data to some extent. This input data processing and output data generation may be implemented in hardware or software. For example, specific electronic components may be employed in a memory controller or similar or related circuitry for implementing the functions associated with testing interconnections between electronic components in accordance with the present disclosure as described above. Alternatively, one or more processors operating in accordance with stored instructions may implement the functions associated with testing interconnections between electronic components in accordance with the present disclosure as described above. If such is the case, it is within the scope of the present disclosure that such instructions may be stored on one or more processor readable carriers (e.g., a magnetic disk), or transmitted to one or more processors via one or more signals.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure can be beneficially implemented in any number of environments for any number of purposes. Accordingly, the claims set forth below should be construed in view of the full breadth and spirit of the present disclosure as described herein.

The invention claimed is:

1. A method for testing interconnections between electronic components, the method comprising:
sending a command from a test controller to each of a plurality of electronic components via a first communication path, the command comprising an instruction for one or more of the plurality of electronic components to transmit a recognizable data pattern directly to the test controller via a second communication path, the second communication path being a common parallel communication path directly coupled to the test controller and each of the plurality of electronic components, the first communication path operating at a first signal transfer rate, the second communication path operating at a second signal transfer rate, the first signal transfer rate being lower than the second signal transfer rate; and
isolating a failure in the first communication path based upon the recognizable data pattern not being transmitted to the test controller via the second communication path.

2. The method of claim 1, wherein the test controller is a memory controller and at least one of the plurality of electronic components is a memory device.

3. The method of claim 1, wherein the first communication path comprises a bidirectional serial link for transferring signals at the first signal transfer rate between the test controller and the plurality of electronic components.

4. The method of claim 3, wherein the bidirectional serial link serially links a last one of the plurality of electronic components to a termination device for terminating the bidirectional serial link.

5. The method of claim 1, wherein the first communication path comprises a unidirectional transmit serial link for transferring signals at the first signal transfer rate from the test controller to the plurality of electronic components, and a unidirectional receive bus for transferring signals at the first signal transfer rate from the plurality of electronic components to the test controller.

6. The method of claim 5, wherein the unidirectional transmit serial link serially links a last of the plurality of electronic components to a termination device for terminating the unidirectional transmit serial link.

7. The method of claim 5, wherein the unidirectional receive bus is connected to a termination device for terminating the unidirectional receive bus.

8. The method of claim 1, wherein the first communication path comprises a unidirectional transmit bus for transferring signals at the first signal transfer rate from the test controller to the plurality of electronic components, and a unidirectional receive serial link for transferring signals at the first signal transfer rate from the plurality of electronic components to the test controller.

9. The method of claim 8, wherein the unidirectional receive serial link serially links a last of the plurality of electronic components to a termination device for terminating the unidirectional receive serial link.

10. The method of claim 8, wherein the unidirectional transmit bus is connected to a termination device for terminating the unidirectional transmit bus.

11. The method of claim 1, wherein the first communication path comprises a bidirectional bus for transferring signals at the first signal transfer rate between the test controller and the plurality of electronic components.

12. The method of claim 11, wherein the bidirectional bus is connected to a termination device for terminating the bidirectional bus.

13. At least one signal embodied in at least one carrier wave for transmitting a computer program of instructions configured to be readable by at least one processor for instructing the at least one processor to execute a computer process for performing the method as recited in claim 1.

14. At least one processor readable carrier for storing a computer program of instructions configured to be readable by at least one processor for instructing the at least one processor to execute a computer process for performing the method as recited in claim 1.

15. An apparatus for testing interconnections between electronic components, the apparatus comprising:

means for sending a command from a test controller to each of a plurality of electronic components via a first communication path, the command comprising an instruction for one or more of the plurality of electronic components to transmit a recognizable data pattern directly to the test controller via a second communication path, the second communication path being a common parallel communication path directly coupled to the test controller and each of the plurality of electronic components, the first communication path operating at a first signal transfer rate, the second communication path operating at a second signal transfer rate, the first signal transfer rate being lower than the second signal transfer rate; and means for isolating a failure in the first communication path based upon the recognizable data pattern not being transmitted to the test controller via the second communication path.

16. A method for testing device-to-device interconnects, the method comprising:

sending a test command signal from a controller to each of a plurality of electronic components via a serial communication path;

transmitting, from each of the plurality of electronic devices that receives the test command signal, a recognizable data pattern directly to the controller via a common parallel communication path directly coupled to the controller and each of the plurality of electronic components;

receiving the recognizable data patterns at the controller from the plurality of electronic components; and verifying the operation of the serial communication path based upon the received recognizable data patterns.

17. The method of claim 16, wherein the controller is a memory controller and at least one of the plurality of electronic components is a memory device.

18. The method of claim 16, wherein the serial communication path comprises a bidirectional serial link for transferring signals between the controller and the plurality of electronic components.

19. The method of claim 18, wherein the bidirectional serial link serially links a last one of the plurality of electronic components to a termination device for terminating the bidirectional serial link.

20. The method of claim 16, wherein the serial communication path comprises a unidirectional transmit serial link for transferring signals from the controller to the plurality of electronic components, and a unidirectional receive bus for transferring signals from the plurality of electronic components to the test controller.

21. The method of claim 20, wherein the unidirectional transmit serial link serially links a last of the plurality of electronic components to a termination device for terminating the unidirectional transmit serial link.

22. The method of claim 20, wherein the unidirectional receive bus is connected to a termination device for terminating the unidirectional receive bus.

23. The method of claim 16, wherein the serial communication path comprises a unidirectional transmit bus for transferring signals from the test controller to the plurality of electronic components, and a unidirectional receive serial link for transferring signals from the plurality of electronic components to the test controller.

24. The method of claim 23, wherein the unidirectional receive serial link serially links a last of the plurality of electronic components to a termination device for terminating the unidirectional receive serial link.

25. The method of claim 23, wherein the unidirectional transmit bus is connected to a termination device for terminating the unidirectional transmit bus.

26. The method of claim 16, wherein the serial communication path comprises a bidirectional bus for transferring signals between the test controller and the plurality of electronic components.

27. The method of claim 26, wherein the bidirectional bus is connected to a termination device for terminating the bidirectional bus.

28. At least one signal embodied in at least one carrier wave for transmitting a computer program of instructions configured to be readable by at least one processor for instructing the at least one processor to execute a computer process for performing the method as recited in claim 16.

29. At least one processor readable carrier for storing a computer program of instructions configured to be readable by at least one processor for instructing the at least one processor to execute a computer process for performing the method as recited in claim 16.

30. An apparatus for testing device-to-device interconnects, the apparatus comprising:
- means for sending a test command signal from a controller to each of a plurality of electronic components via a serial communication path;
- means for transmitting, from each of the plurality of electronic devices that receives the test command signal, a recognizable data pattern directly to the controller via a common parallel communication path directly coupled to the controller and each of the plurality of electronic components;
- means for receiving the recognizable data patterns at the controller from the plurality of electronic components; and
- means for verifying the operation of the serial communication path based upon the received recognizable data patterns.

* * * * *